United States Patent [19]

Koerner et al.

[11] Patent Number: 5,233,637
[45] Date of Patent: Aug. 3, 1993

[54] SYSTEM FOR GENERATING AN ANALOG REGULATING VOLTAGE

[75] Inventors: Christopher Koerner, Longmont; Alberto Gutierrez, Jr., Fort Collins; James O. Barnes, Fort Collins; James R. Hulings, Fort Collins, all of Colo.

[73] Assignee: Hewlett-Packard Company, Palo Alto, Calif.

[21] Appl. No.: 786,690

[22] Filed: Nov. 1, 1991

[51] Int. Cl.$^5$ .............................................. H03K 13/02
[52] U.S. Cl. ....................................... 377/42; 377/76; 307/265; 324/158 T
[58] Field of Search .................... 377/42, 76; 307/265; 324/158 T

[56] References Cited

U.S. PATENT DOCUMENTS

| | | | |
|---|---|---|---|
| 4,151,603 | 4/1979 | Gladstein | 365/203 |
| 4,504,749 | 3/1985 | Yoshida | 307/590 |
| 4,551,705 | 11/1985 | Anderson | 357/23.1 |
| 4,700,089 | 10/1987 | Fujii et al. | 307/605 |
| 4,754,164 | 6/1988 | Flora et al. | 307/269 |
| 4,806,804 | 2/1989 | O'Leary | 307/605 |
| 4,899,071 | 2/1990 | Morales | 307/605 |
| 4,947,064 | 8/1990 | Kim et al. | 307/594 |
| 5,036,230 | 7/1991 | Bazes | 377/76 |

OTHER PUBLICATIONS

"A 10-ps Resolution, Process-Insensitive Timing Generator IC", Otsuji et al., IEEE Journal of Solid-State Circuits, vol. 24, No. 5, Oct. 19, 1989, pp. 1412-1418.
"A 3-ns Range . . . Utilizing Si Bipolar", Otsuji et al., IEEE Journal of Solid State Circuits, vol. 26, No. 5, May 19, 1991, pp. 806-811.
"Integrated Pin Electronics for VLSI Functional Testers", Gasbarro et al., IEEE Journal of Solid State Circuits, vol. 24, No. 2, Apr. 1989, pp. 331-337.
"Bt605 125 MHz 10KH ECL Compatible Programmable Timing Edge Vernier" Brooktree Corp. 9950 Barnes Canyon Rd., San Diego, Calif. 92121, pp. 9-17-9-28.
"Integrated Pin Electronics For A VLSI Test System", Branson et al., IEEE 1988 International Test Conference, pp. 23-27.

Primary Examiner—William L. Sikes
Assistant Examiner—Scott A. Ouellette
Attorney, Agent, or Firm—Guy J. Kelley

[57] ABSTRACT

A system for generating an analog regulating voltage to be supplied to one or more circuit elements on an integrated circuit. The circuit elements have operational characteristics that are voltage dependent and the analog regulating voltage having the a property of changing with temperature, power supply voltage, and manufacturing process variations so as to substantially eliminate the effects of such variations on the operational characteristics of the circuit elements.

5 Claims, 1 Drawing Sheet

SYSTEM FOR GENERATING AN ANALOG REGULATING VOLTAGE

CROSS REFERENCE TO RELATED APPLICATIONS

The following applications of common assignee and contain some common disclosure, and believed to have an effective filing date identical with that of the present application:
CMOS PSEUDO-NMOS PROGRAMMABLE CAPACITANCE TIME VERNIER AND METHOD OF CALIBRATION, Ser. No. 07/786,447;
PSEUDO-NMOS PROGRAMMABLE CAPACITANCE Ser. No. 07/786,633;
CMOS PSEUDO-NMOS PROGRAMMABLE CAPACITANCE TIME VERNIER SYSTEM AND METHOD FOR CONTROLLED DELAY OF TIMING EDGES, Ser. No. 07/786,695;
PSEUDO-NMOS FINE/COARSE WIRED-OR TAPPED Ser. No. 07/786,459;
The disclosure of the above listed applications are incorporated herein by reference as if set forth in full below.

BACKGROUND OF THE INVENTION

1. Field of the Invention

The present invention relates generally to electronic systems where accurate and stable signal edge placement is required. More particularly, the present invention relates to a system and method of operation of a variable width current mirror digital-to-analog converter (DAC) for generating a control voltage for a time delay element.

2. Related Art

Many conventional discrete and gate array devices are used in the electronics industry for adjusting the phase of digital signals. Such phase adjustment is typically accomplished by delaying the rising or falling edge of the digital pulses. Examples of such discrete devices are described in U.S. Pat. No. 4,947,064 to Kim, U.S. Pat. No. 4,899,071 to Morales, and U.S. Pat. No. 4,806,804 to O'Leary. All teach circuits to implement such delays. An implementation of a delay circuit for gate array LSI is taught by U.S. Pat. No. 4,700,089 to Fujii, et al.

However, due to the power supply, temperature, and manufacturing process variations the discrete amounts of delay produced by the conventional circuits can vary. Such inaccuracies are acceptable in most general applications of the delay elements, but are unacceptable for systems such as testing and calibration systems.

SUMMARY OF THE INVENTION

The present invention provides a system and method of generating a control voltage that can be used in integrated circuit test system environments to compensate for temperature, power supply and process variations. The control voltage is useful for driving a PMOS FET of an otherwise standard CMOS inverter in order to implement a pseudo-NMOS (PNMOS) technology which emulates NMOS logic using technology which is not technically NMOS.

The present invention is directed to a system and method for generating a control voltage that can be used in integrated circuit test system environments to compensate for temperature, power supply and process variations encountered during manufacturing and operation of integrated circuit chips. A digital input is provided to a decoder to specify a required voltage adjustment to be provided to a node. A variable gate width means is connected to the decoder and to the node to provide the required voltage adjustment to the node to effectuate an analog output.

FEATURES AND ADVANTAGES OF THE INVENTION

First, one advantage of using the present invention includes the fact that the digitally controlled voltage can be used to set the speed of the device. In essence, an adjustable control for a user is provided to, for example, compensate for process variation. Furthermore, the relationship between the digital input and the delay is linear to the first order.

Second, the present invention provides a general method for temperature and power supply compensation based on a current referenced current mirror and pseudo-NMOS circuitry. This pseudo-NMOS circuitry has very good linearity of delay versus DAC digital input when compared to conventional approaches and also lends itself very well to VLSI.

Third, the power supply variability of this approach (current-mirror-PNMOS delay element) is opposite to that of standard CMOS. This means that CMOS and PNMOS circuits can be combined, for instance, on the same chip, such that the CMOS and PNMOS delay variation due to power supply changes cancel each other.

Pseudo-NMOS implementations are utilized for delaying negative timing edges. Further embodiments of the present invention include pseudo-PMOS circuits for controlled delay of positive timing edges. Still further embodiments of the present invention include alternating pseudo-NMOS/PMOS circuits for controlled delay of both negative and positive edges.

Further advantages of the present invention will become apparent to one skilled in the art upon examination of the following drawings and the detailed description. It is intended that any additional advantages be incorporated herein.

BRIEF DESCRIPTION OF THE DRAWINGS

The present invention, as defined in the claims, can be better understood with reference to the text and to the following drawing.

DETAILED DESCRIPTION OF THE PREFERRED EMBODIMENTS

Figure 1:
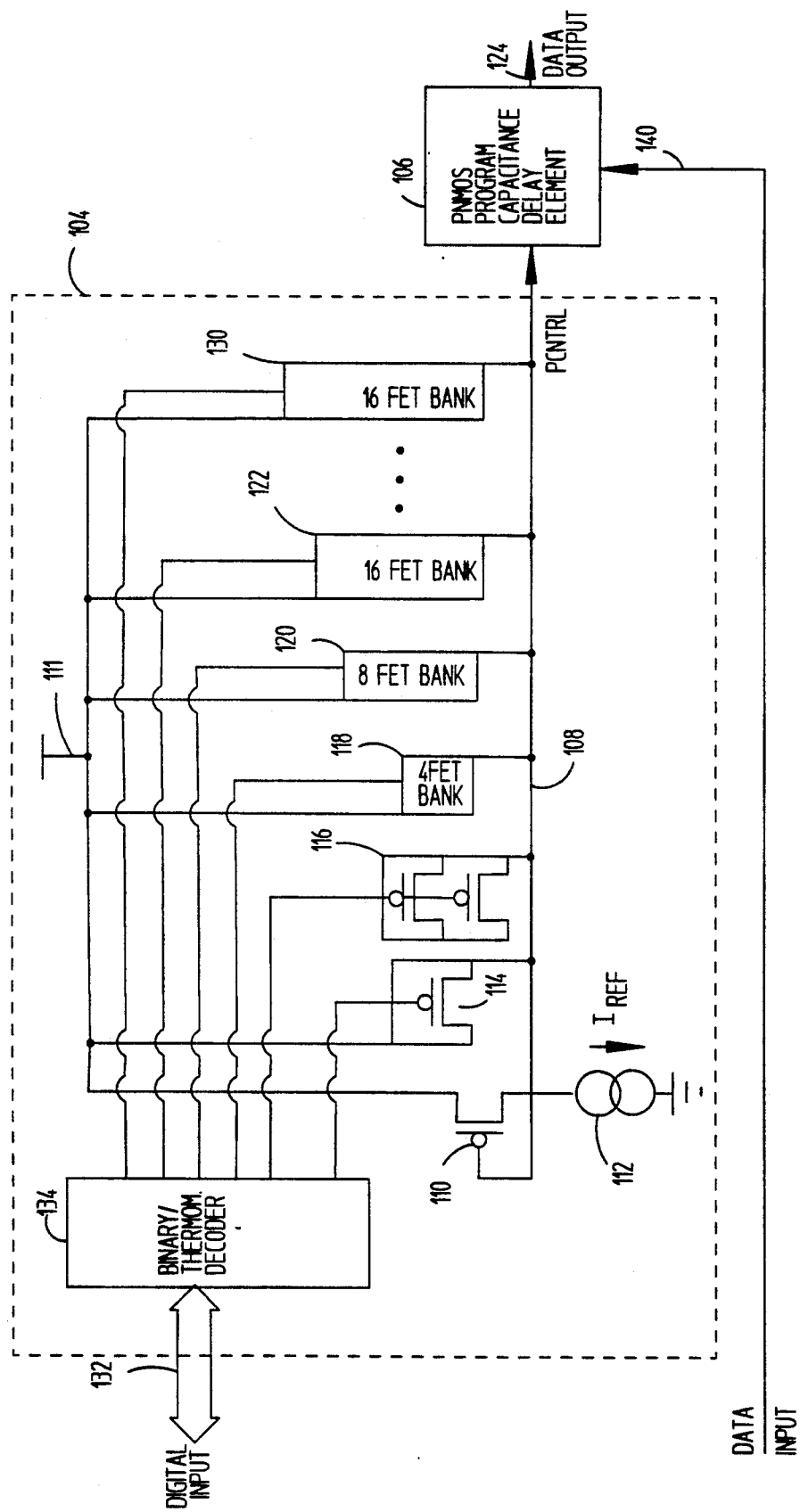
FIG. 1 is a block level diagram of a preferred embodiment of the DAC system of the present invention.

The present invention provides an improvement of approximately 3:1 in temperature and power supply sensitivity as compared to simulations using standard CMOS technology. This improvement is useful for gaining much tighter control over reducing the timing variability of an integrated circuit test system due to temperature and power supply variations. This applicability is necessary for isolating circuit-under-test behavior from a test system. In addition, the present invention has a digital input for specifying incremental adjustments in the delay element delay while offering compensation for power supply and temperature variations.

Moreover, the present invention has a transfer function in voltage between the control voltage output of the present invention and the digital input used for specifying incremental adjustments. This transfer function is non-linear, and is approximately inversely dependent on the square root of N, where N is the digital input. However, an analysis of the transfer function between the digital input to the DAC and the actual delay obtained from the input to the output of the previously referenced variable capacitance delay element reveals a first order linear relationship. Therefore, a more easily controllable linear relationship between an actual delayed output of a connected delay element system and the digital input to this system is provided despite the non-linear transfer function in voltage obtained by the current mirror portion of the system.

In accordance with the present invention, the architecture is comprised of a variable-width current mirror DAC and a variable capacitance delay element implemented with a pseudo-NMOS technology. As discussed below and in the related cases, the pseudo-NMOS circuit provides fine control of a negative timing edge. The PMOS gates of the buffers are driven by the output (PCNTRL) of the variable width current mirror DAC, where N is a digital input to the DAC and the transfer function between the output of the current mirror and the digital input is non-linear (inversely dependent on N). Since the DAC is referenced to a stable fixed current source (with regard to temperature and power supply variation), PCNTRL automatically adjusts with temperature, process, and power supply variations.

In one embodiment, the control voltage PCNTRL regulates the current into the variable capacitance and is used for adjusting for process variations in obtaining a nominal delay across the integrated circuit. However, in other applications, the control voltage PCNTRL may be used for general delay control.

A delay element uses the current mirrored by the DAC (charging current) to charge the capacitance on its internal node. The time to charge the internal node is inversely proportional to the charging current. However, the charging current is inversely proportional to the DAC width. Therefore, the end result is that the delay increases proportionately with the DAC width. It is interesting to note that, although the digital input versus the control voltage PCNTRL is non-linear (inversely dependent on N), the digital input versus delay is linear to the first order. The DAC control voltage may be used to drive several delay lines.

The present invention is shown at a FET architectural perspective in FIG. 1.

Referring now to FIG. 1, a logic diagram is shown of the high level structure comprising a preferred embodiment of a DAC system of the present invention. The system is made up of a current mirror DAC 104 that is connected to a pseudo-NMOS (PNMOS) programmable capacitance delay element 106 (described in detail in the above referenced application Ser. No. 07/786,633) via a control voltage PCNTRL tapped off of node 108. The current mirror DAC 104 is made up of a PMOS FET 110 with the gate and drain connected to an analog current source 112. These connections create the node 108 which generates the voltage termed PCNTRL, which adjusts itself to always mirror the same amount of current $I_{REF}$ supplied by current source 112 to an equivalent PMOS device.

As shown in FIG. 1, a multitude of PMOS FET banks, namely 114-130, may be connected to the node 108 of the current mirror DAC 104 in order to enable small voltage adjustments to be made to node 108 as necessary. As shown, bank 114 contains one FET, bank 116 contains two FETs, bank 118 contains four FETs, bank 120 contains eight FETs, and banks 122-130 contain sixteen FETs each.

The voltage adjustments are controlled via digital input 132, which specifies in a digital format the adjustment required. As illustrated by a decoder 134, the digital input 132 is decoded such that discrete amounts of FET width from selected PMOS FET banks 114-130 are added to the width of PMOS FET 110. The output line from the decoder 134 that corresponds to the bank 114 represents the least significant bit (LSB) and the line corresponding to the bank 130 represents the most significant bit (MSB). The current mirrored to the PNMOS delay element 106 is specified by the width-to-length ratio of the selected PMOS FETs in the current mirror DAC 104 and the width-to-length ratio of the PNMOS delay element 106. This specification is shown in equation form below:

$$I_{mirrored} = \frac{(W_{PNMOS}/L_{PNMOS})}{(W_{DAC}/L_{DAC})} * I_{REF} \quad \text{[Assuming Saturation]}$$

The current mirror DAC 104 FET width is variable as represented by the expression below:

$$W_{DAC} = W_O + NW_i$$

where:
$W_O$ = the initial equivalent channel width for the system
$N$ = the value of digital input 132
$W_i$ = the channel width of the LSB FET Therefore, the mirrored current becomes:

$$I_{mirrored} = \frac{W_{PNMOS}/L_{PNMOS}}{(W_O + NW_i)/L_{DAC}} * I_{REF}$$

These equations assume that all respective FETs are in saturation, which is not always true. Nonetheless, these equations are useful to illustrate the DAC system function.

Since the voltage out of the current mirror DAC 104 is controlled by a current mirror, the current mirror compensates for temperature and power supply changes such that the $I_{REF}$ is reflected as indicated in the equations above.

Two different forms of decoding are utilized by the decoder 134. In the preferred embodiment, a multitude of PMOS FET banks are connected to the current mirror DAC 104 at node 108. PMOS FET banks 120-130 provide the MSB (Most Significant Bits) for the current mirror. These bits are decoded using a thermometer decoding method, which decodes in incremental units with no binary weighting. An example of thermometer decoding for values 0 through 3 is shown in Table 1:

TABLE 1

| Digital Value | Decoded Result |
| --- | --- |
| 0 | All bits OFF. |
| 1 | 1st bit ON; stay on. |
| 2 | 2nd bit ON in addition to 1st; stay on. |
| 3 | 3rd bit ON in addition to 1st and 2nd. Note that 3 bits go ON. |

In contrast, PMOS FET Banks 114-118 provide the LSBs (Least Significant Bits) for the current mirror. These Banks are selected using a binary decoding method, which decodes according to standard binary weighting.

The dividing point between binary and thermometer decoding is determined by the specific application. In the application of the preferred embodiment, the dividing point at the FET banks consisting of 16 PMOS FETs gives a 16-to-1 MSB-to-LSB ratio. This ratio is in contrast to a 64-to-1 MSB-to-LSB ratio if strict binary decoding had been used throughout the entire group of FET banks. The net effect is that the device mismatch due to processing is reduced to a 16-to-1 MSB-to-LSB ratio.

The transfer function in voltage at the node 108 between the PCNTRL output connected to the node 108 and the digital input 132 of the current mirror DAC 104 is non-linear and is inversely dependent on N, where N is the digital value at the input 132.

The PCNTRL output connected to the node 108 is connected to the variable capacitance delay element 106 in order to provide a control voltage which enables the delay element 106 to provide a specified delay to a coarse timing edge data input 140. Finally, delay element 106 provides a well-controlled fine timing edge data output 124 from data input 140.

As a function of the digital input 132, the voltage (PCNTRL) and the mirrored current at node 108 both are inversely dependent on N:

$$I_{mirrored} = \frac{W_{PNMOS}/L_{PNMOS}}{(W_0 + NW_i)/L_{DAC}} \cdot I_{REF} \quad \text{[Assumes Saturation]}$$

$$(V_{GS} - V_T)^2 = \frac{\frac{I_{REF}}{K(W_0 + NW_i)}}{L_{DAC}} \quad \text{[Assumes Saturation]}$$

$V_{GS}$ is equivalent to the PCNTRL voltage referenced to the positive supply. $V_T$ is the threshold voltage of the PMOS FET 110 and the PMOS FET banks 114–130.

However, although an inverse N relationship exists for both the voltage and the current from the current mirror DAC 104, the delay reflected to the delay element 106 is proportional to the digital input 132. This feature of the present invention is best illustrated by considering the amount of time necessary to charge a capacitor C with a constant current:

$$I = \frac{CdV}{dt}$$

or approximately:

$$\Delta T = \frac{C\Delta V}{I}$$

Substituting the mirrored current from the current mirror DAC 104 for I in the above equation gives:

$$\Delta T = \frac{C\Delta V}{\frac{(W_{PNMOS}/L_{PNMOS})}{(W_0 + NW_i)/L_{DAC}} \cdot I_{REF}}$$

or:

$$\Delta T = \frac{C\Delta V}{I_{REF}} \cdot \frac{(W_0 + NW_i)/L_{DAC}}{W_{PNMOS}/L_{PNMOS}}$$

Therefore, the linear delay for the above situation is given by an intrinsic delay:

$$\left( \frac{C\Delta V}{I_{REF}} \cdot \frac{W_0/L_{DAC}}{W_{PNMOS}/L_{PNMOS}} \right)$$

plus a discrete amount of delay:

$$\left( \frac{NC\Delta V}{I_{REF}} \cdot \frac{W_i/L_{DAC}}{W_{PNMOS}/L_{PNMOS}} \right)$$

added by the digital programming from the digital input 132.

While various embodiments of the present invention have been described above, it should be understood that they have been presented by way of example, and not limitation. Thus the breadth and scope of the present invention should not be limited by any of the above-described exemplary embodiments, but should be defined only in accordance with the following claims and their equivalents.

What is claimed is:

1. A system for generating an analog regulating voltage at a node to be supplied to one or more circuit elements coupled to the node in an integrated circuit, the circuit elements having operational characteristics that are voltage dependent, the analog regulating voltage changing with temperature, power supply voltage, and manufacturing process variations so as to substantially offset the effects of such variations on the operational characteristics of the circuit elements, comprising:

(a) a stable current source coupled to the node;
   (b) a field effect transistor formed on the integrated circuit and having a source electrode coupled to a power supply, and gate and drain electrodes coupled to the node, wherein said field effect transistor has an inherent resistance that varies as a function of temperature, power supply voltage, and manufacturing process variations and that causes the analog regulating voltage to be produced which varies as a function of variations in said inherent resistance; and
   (c) means, coupled to the node, for selectively adjusting the analog regulating voltage, wherein said means for selectively adjusting has further resistance that varies as a function of temperature, power supply voltage, and manufacturing process variations and that causes the analog regulating voltage to be varied as a function of variations in said further resistance;

wherein the effects of temperature, power supply voltage, and manufacturing process variations on the circuit elements are substantially offset by the analog regulating voltage.

2. The system according to claim 1, wherein said means for selectively adjusting the analog regulating voltage further comprises:

a decoder configured to receive and decode a digital input signal and generate a control signal in response thereto; and
   means, responsive to said control signal and coupled to said decoder and the node, for adding said further resistance to said node and in parallel with said inherent resistance, to adjust the analog regulating voltage as a function of the digital input signal, and to thereby adjust the operational characteristics of the one or more circuit elements.

3. The system according to claim 2, wherein said means for adding said further resistance further comprises:

an array of field effect transistors (FETs), wherein groups of said array of FETs are operatively configured to be selectively coupled to the node according to the digital input signal, thereby enabling said further resistance to cause voltage adjustments in the analog regulating voltage.

4. The system according to claim 3, wherein said decoder decodes according to at least one of a binary and a thermometer decode scheme to thereby provide programmability of said array of FETs.

5. The system of claim 3, wherein the operational characteristic of each circuit element is a propagation delay of a signal through that circuit element.

* * * * *